(12) United States Patent
Arno

(10) Patent No.: US 10,803,911 B2
(45) Date of Patent: Oct. 13, 2020

(54) LOW OFFSET CURRENT SENSE AMPLIFIER

(71) Applicant: STMICROELECTRONICS (ALPS) SAS, Grenoble (FR)

(72) Inventor: Patrik Arno, Sassenage (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 301 days.

(21) Appl. No.: 15/884,229

(22) Filed: Jan. 30, 2018

(65) Prior Publication Data
US 2018/0301174 A1 Oct. 18, 2018

(30) Foreign Application Priority Data
Apr. 14, 2017 (FR) ...................................... 17 53276

(51) Int. Cl.
| | | |
|---|---|---|
| G11C 7/06 | (2006.01) |
| G11C 7/08 | (2006.01) |
| G01R 15/14 | (2006.01) |
| G06F 13/42 | (2006.01) |
| G06F 1/18 | (2006.01) |
| G01R 19/00 | (2006.01) |

(52) U.S. Cl.
CPC .............. *G11C 7/062* (2013.01); *G01R 15/14* (2013.01); *G01R 19/0092* (2013.01); *G06F 1/189* (2013.01); *G06F 13/4282* (2013.01); *G11C 7/08* (2013.01)

(58) Field of Classification Search
CPC ...... G11C 7/062; G11C 7/08; G01R 19/0092; G01R 15/14; G06F 13/4282; G06F 1/189; H03F 3/45183
See application file for complete search history.

(56) References Cited

U.S. PATENT DOCUMENTS

| | | | | |
|---|---|---|---|---|
| 8,704,588 B2* | 4/2014 | Conte | ....................... | G05F 3/30 323/313 |
| 2008/0284403 A1* | 11/2008 | Miranda | ................... | G05F 5/00 323/303 |
| 2009/0316454 A1* | 12/2009 | Colbeck | ............. | H02M 1/4225 363/89 |
| 2013/0147559 A1* | 6/2013 | Schaffer | ................. | H03F 3/211 330/257 |

(Continued)

OTHER PUBLICATIONS

"AN840: Redefining a New State-of-the-Art in Microampere Current-Sense Amplifiers," Silicon Labs, Rev. 1.1, 2012, 5 pages.

(Continued)

*Primary Examiner* — Christopher P McAndrew
*Assistant Examiner* — Zannatul Ferdous
(74) *Attorney, Agent, or Firm* — Seed Intellectual Property Law Group LLP

(57) ABSTRACT

A current sense amplifier includes: first and second intermediate nodes coupled to first and second nodes of a sense resistor by a chopper, and to respective branches of a current mirror; a differential amplifier having inputs coupled to the first and second intermediate nodes and adapted to generate first and second voltage signals; and first and second transistors adapted to be controlled by the first and second voltage signals respectively and each having one of its main current conducting nodes coupled to a respective one of the first and second intermediate nodes.

20 Claims, 3 Drawing Sheets

(56) References Cited

U.S. PATENT DOCUMENTS

| | | | |
|---|---|---|---|
| 2013/0271216 A1 | 10/2013 | Liu et al. | |
| 2014/0285133 A1* | 9/2014 | Toledo | H02J 7/007 |
| | | | 320/101 |
| 2016/0082845 A1* | 3/2016 | Yamaguchi | H02J 1/00 |
| | | | 307/10.1 |
| 2016/0173041 A1* | 6/2016 | Prasad | H03F 3/393 |
| | | | 330/9 |
| 2016/0291631 A1* | 10/2016 | Sen | H02M 3/158 |

OTHER PUBLICATIONS

Christoforou et al., "A Chopper-based, CMOS Current Sense Amplifier for Power Management Applications in Mobile Communications," *TELSIKS 2001*, IEEE, Niš, Yugoslavia, Sep. 19-21, 2001, pp. 149-150.

Christoforou, "A chopper-based CMOS current sense instrumentation amplifier," *IEEE Instrumentation and Measurement Technology Conference*, IEEE, Anchorage, Alaska, May 21-23, 2002, pp. 271-273.

\* cited by examiner

LOW OFFSET CURRENT SENSE AMPLIFIER

BACKGROUND

Technical Field

The present disclosure relates to the field of current sense amplifiers, and in particular to a current sense amplifier having a relatively low offset.

Description of the Related Art

Current sense amplifiers are used for applications in which it is desired to measure the level of a current supplied to a load. Current sense amplifiers generally comprise a sense resistor of low resistance positioned along the path of the current, and a differential amplifier for amplifying the voltage drop across the sense resistor in order to estimate the current. Depending on the application, an analog to digital converter may then be used to convert the output signal into a digital value.

A difficulty with known current sense amplifiers is that they tend to lack precision. For some applications, there is thus a desire for a current sense amplifier having improved accuracy.

A further difficulty is that known current sense amplifiers generally permit the level of a current to be measured only when the current is flowing in one direction through the sense resistor. There is thus a desire for a current sense amplifier that can detect the level of currents flowing in either direction through the sense resistor.

BRIEF SUMMARY

According to one aspect, there is provided a current sense amplifier comprising: a sense resistor conducting a current to be measured; first and second intermediate nodes coupled to first and second nodes of the sense resistor by a chopper, and to respective branches of a current mirror; a differential amplifier having inputs coupled to the first and second intermediate nodes and adapted to generate a first voltage signal when the voltage at the first intermediate node is greater than that of the second intermediate node, and to generate a second voltage signal when the voltage at the second intermediate node is greater than that of the first intermediate node; a first transistor adapted to be controlled by the first voltage signal and having one of its main current conducting nodes coupled to one of the first and second intermediate nodes; and a second transistor adapted to be controlled by the second voltage signal and having one of its main current conducting nodes coupled to the other of the first and second intermediate nodes.

According to one embodiment, the current sense amplifier further comprises an output resistor coupled to: further main current conducting nodes of the first and second transistors; or to main current conducting nodes of third and fourth transistors, the third and fourth transistors being respectively controlled by the first and second voltage signals.

According to one embodiment, the current sense amplifier further comprises a first input resistor coupling the chopper to the first intermediate node and a second input resistor coupling the chopper to the second intermediate node.

According to one embodiment, the chopper comprises: a first switch coupling the first node of the sense resistor to the first input resistor; a second switch coupling the second node of the sense resistor to the second input resistor; a third switch coupling the first node of the sense resistor to the second input resistor; and a fourth switch coupling the second node of the sense resistor to the first input resistor.

According to one embodiment, the current sense amplifier further comprises a control circuit adapted to generate, based on a clock signal, a first phase signal for controlling the first and second switches; and a second phase signal for controlling the third and fourth switches.

According to one embodiment, the control circuit is adapted to control the chopper to have a duty cycle of between 49.5 and 50.5 percent.

According to one embodiment, the current mirror comprises a fifth transistor coupling the first intermediate node to a supply voltage rail or ground rail and a sixth transistor coupling the second intermediate node to the supply voltage rail or ground rail, the control nodes of the fifth and sixth transistors being coupled together and to the first or second intermediate node.

According to a further aspect, there is provided a universal serial bus port comprising the above current sense amplifier.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

As used herein, the term "connected" is used to designate a direct electrical connection between components, whereas the term "coupled" is used to designate a connection that may be direct, or may be via one or more intermediate elements such as resistors, capacitors and/or transistors. It will be apparent to those skilled in the art that, where the term "coupled" is employed, a direct connection is equally possible.

The term "around" is used to indicate a tolerance of plus or minus 10 percent of the value in question.

Figure 1:
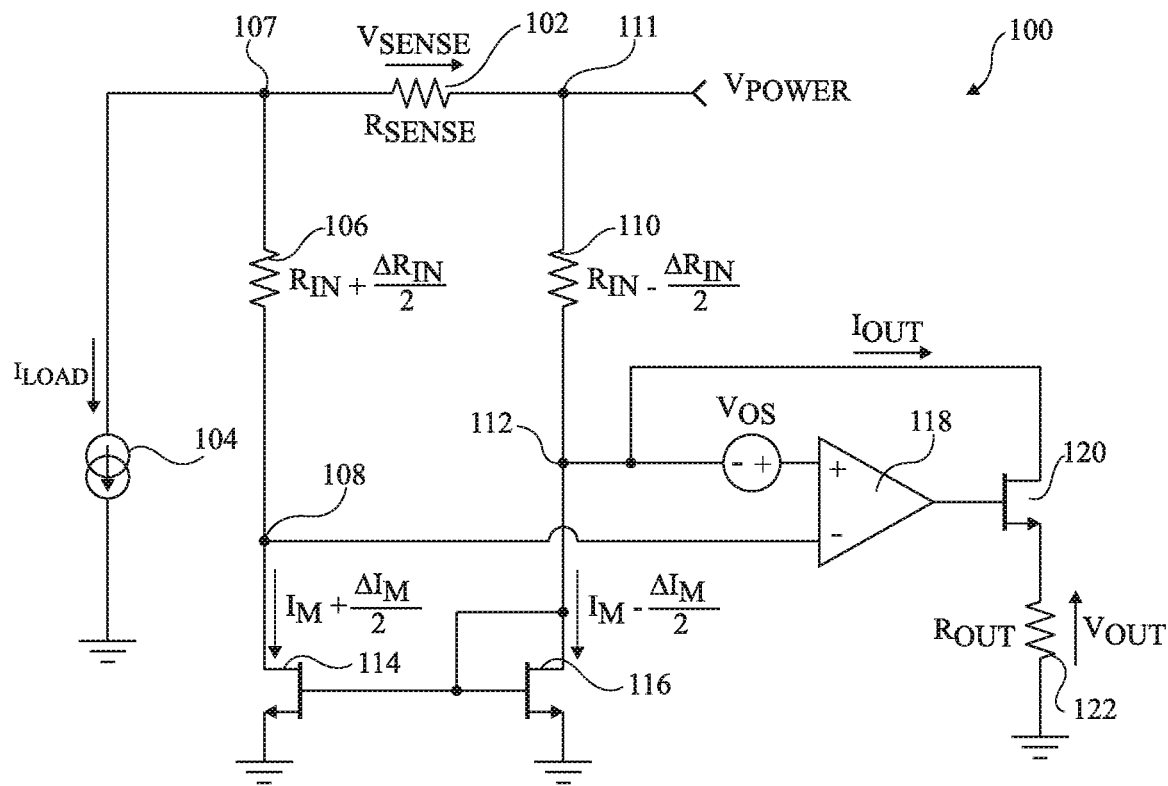
FIG. 1 schematically illustrates a current sense amplifier according to an embodiment that has been proposed.

FIG. 1 schematically illustrates a current sense amplifier 100 according to an example embodiment that has been proposed. A sense resistor 102 having a resistance $R_{SENSE}$ is provided in the current path of the current $I_{LOAD}$ to be measured. For example, the current $I_{LOAD}$ is supplied by a supply voltage $V_{POWER}$, provided for example by a battery, and the current $I_{LOAD}$ supplies a load 104, represented in FIG. 1 as a current source.

The current sense amplifier 100 measures the voltage drop $V_{SENSE}$ across the sense resistor 102. For example, the amplifier 100 comprises an input resistor 106 coupled between one node 107 of the sense resistor 102 and an intermediate node 108, and a further input resistor 110 coupled between the other node 111 of the sense resistor 102 and a further intermediate node 112.

The intermediate nodes 108 and 112 are coupled to respective branches of a current mirror formed by transistors 114 and 116. The transistors 114 and 116 are for example n-channel MOS transistors having their gates coupled together and to the intermediate node 112. The intermediate nodes 108 and 112 are also respectively coupled to negative and positive inputs of a differential amplifier 118. The differential amplifier 118 has its output coupled to the gate of a further transistor 120, which is for example an n-channel MOS transistor. The transistor 120 is coupled in series, via its main current conducting nodes, with an output resistor 122, and has its drain coupled to the node 112. The voltage $V_{OUT}$ across the resistor 122 provides the output voltage of the current sense amplifier 100. The resistors 106 and 110 are designed to have a same resistance $R_{IN}$, and the resistance $R_{OUT}$ of the resistor 122 is for example a multiple of the resistance $R_{IN}$, thereby introducing a gain in the output voltage $V_{OUT}$.

In operation, assuming a current flowing through the sense resistor 102 from the node 111 towards the node 107, the voltage at the node 111 will be higher than the voltage at the node 107. The transistors 114 and 116 of the current mirror are each designed to conduct a same current $I_M$. The differential amplifier 118 will bring the voltages at the nodes 108 and 112 to the same level by controlling the transistor 120. The resistor 110 will thus conduct an additional current with respect to the resistor 106, this additional current corresponding to the current $I_{OUT}$ conducted by the transistor 120.

A drawback of the current sense amplifier 100 of FIG. 1 is that there are several sources of imprecision that have been identified by the present inventor. For example, a difference in resistance between the resistors 106 and 110, a mismatch between the transistors 114 and 116, and a voltage offset of the differential amplifier 118 will all lead to an offset in the output signal $V_{OUT}$. For example, calling the resistance of the resistors 106 and 110 respectively $R_{IN}+\Delta R_{IN}/2$ and $R_{IN}-\Delta R_{IN}/2$, where $\Delta R_{IN}$ is the difference in resistance between the resistors 106, 110, the currents conducted by the transistors 114 and 116 respectively $I_M+\Delta I_M/2$ and $I_M-\Delta I_M/2$, where $\Delta I_M$ is the difference between the currents, and the voltage offset of the amplifier 118 $V_{OS}$, the voltage $V_{OUT}$ will have the following equation:

$$V_{OUT} \cong I_{LOAD} \cdot R_{SENSE} \cdot \frac{R_{OUT}}{R_{IN}} + V_{OFFSET}$$

where:

$$V_{OFFSET} = \left[ V_{OS} - \Delta I_M \cdot R_{IN} + I_M \cdot \Delta R_{IN} + I_{OUT} \cdot \frac{\Delta R_{IN}}{2} \right] \cdot \frac{R_{OUT}}{R_{IN}}$$

A further drawback with the arrangement of FIG. 1 is that it relies on the voltage at node 112 being higher than the voltage at the node 108. Therefore, the circuit cannot detect the current level if the current $I_{LOAD}$ to be measured is negative. For example, in some cases, the current sense amplifier could be used to monitor the current being drawn by a load connected to a USB (universal serial bus) type C port. As known by those skilled in the art, a USB type C port conforming to the USB power deliver specification is capable of providing power delivery to a load at voltages of up to 20 V. If the USB type C port adapted for power delivery is inadvertently coupled to a power source rather than a load, a current may be driven in the opposite direction through the sense resistor 102. By allowing such a current to be detected, a protection mechanism can be triggered to prevent damage to the power source supplying the voltage $V_{POWER}$.

Figure 2:
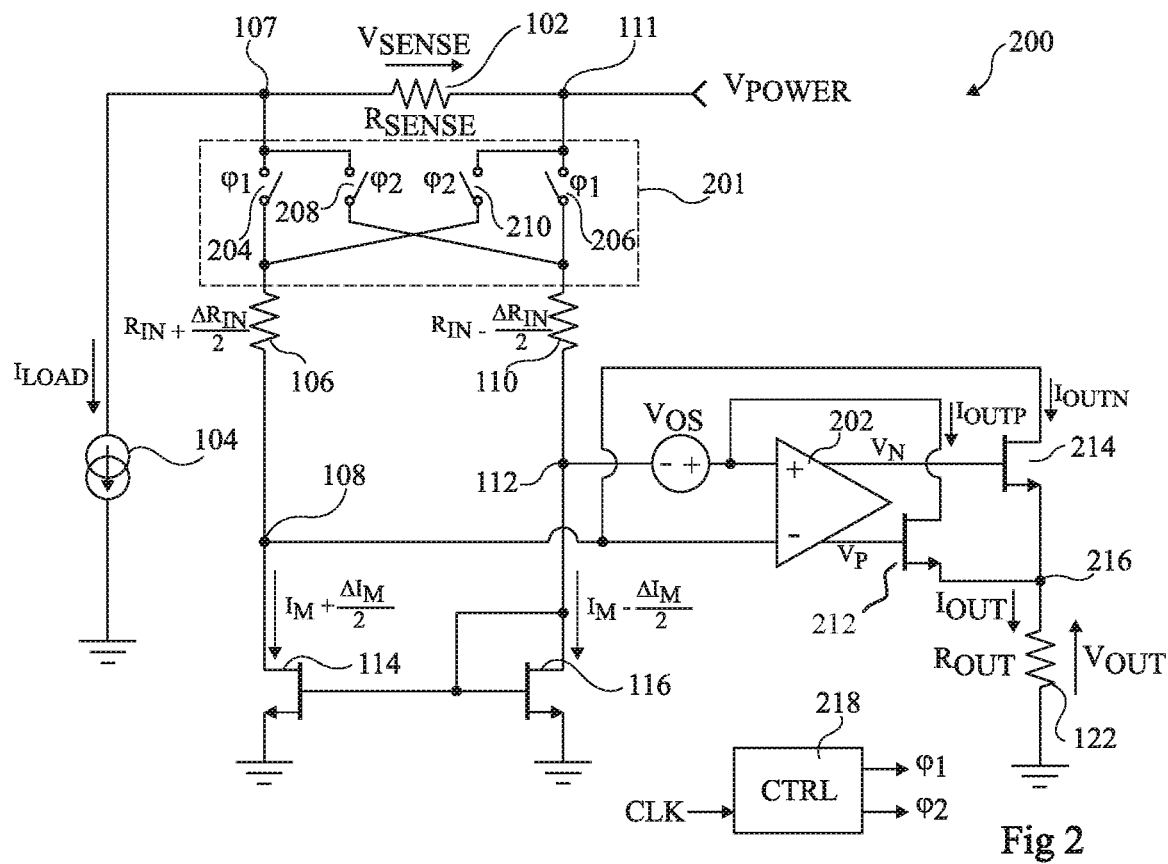
FIG. 2 schematically illustrates a current sense amplifier according to an example embodiment of the present disclosure.

FIG. 2 schematically illustrates a current sense amplifier 200 according to an example embodiment of the present disclosure. The sense amplifier 200 has some features in common with the sense amplifier 100 of FIG. 1, and like features have been labelled with like reference numerals and will not be described again in detail.

In the sense amplifier 200 of FIG. 2, a chopper 201 is positioned between the nodes 107, 111 of the sense resistor 102 and the input resistors 106, 110. For example, the chopper 201 comprises a switch 204 coupled between the node 107 and the resistor 106, and a switch 206 coupled between the node 111 and the resistor 110, a switch 208 coupled between the node 107 and the resistor 110, and a switch 210 coupled between the node 111 and the resistor 106. The switches 204 and 206 are for example controlled by a phase signal $\varphi_1$, and the switches 208 and 210 are for example controlled by a phase signal $\varphi_2$.

The differential amplifier 118 of FIG. 1 is replaced in FIG. 2 by a differential amplifier 202 capable of asserting either of two output signals $V_P$ and $V_N$ based on the polarity of the voltages at the intermediate nodes 108, 112. Furthermore, in the current sense amplifier 200, the transistor 120 is replaced by a transistor 212 controlled by the signal $V_P$ to conduct a current $I_{OUTP}$, and a transistor 214 controlled by the signal $V_N$ to conduct a current $I_{OUTN}$. The transistor 212 is coupled by its main current conducting nodes, for example its source/drain nodes, between the node 112 and an output node 216. The transistor 214 is coupled by its main current conducting nodes, for example its source/drain nodes, between node 108 and the output node 216. The output node 216 is for example coupled to ground by the output resistor 122, and provides the output voltage $V_{OUT}$ of the current sense amplifier 200. When the voltage at the node 112 is greater than the voltage at the node 108, the signal ($V_P$) is for example asserted, and the signal $V_N$ remains low. Thus the transistor 212 and not the transistor 214 will be conducting. On the contrary, when the voltage at the node 108 is greater than that of the node 112, the signal $V_N$ is for example asserted, and the signal ($V_P$) remains low. Thus transistor 214 and not the transistor 212 will be conducting.

A control circuit 218 for example generates the phase signals $\varphi_1$ and $\varphi_2$ based on a clock signal CLK.

In operation, the chopper 201 is for example controlled with a duty cycle of substantially 50 percent, and at a frequency of between 10 Hz and 1 kHz or higher, and for example at a frequency of around 100 Hz. The differential amplifier 202 switches between generating the signal $V_P$ and the signal $V_N$ based on the polarity of the voltages at the nodes 107, 111. The DC component of the output voltage $V_{OUT}$ will thus have a level representing the current passing through the sense resistor 102.

In some embodiments, while not illustrated in FIG. 2, a capacitor may be coupled in parallel with the resistor 122 in order to filter the output signal and extract the DC component. However, depending on the parasitic capacitances present at the output node 216 and on the frequency of the chopper, such a capacitor could be omitted.

The sense resistor 102 for example has a resistance of between 10 and 20 milliohms, input resistors 106 and 110 for example have resistances $R_{IN}$ in the range of 1 to 20 kohms, the output resistor 122 for example has a resistance $R_{OUT}$ in the range of 50 to 500 kohms, and the gain provided by the ratio $R_{OUT}/R_{IN}$ is for example of between 2 and 100.

Figure 3:
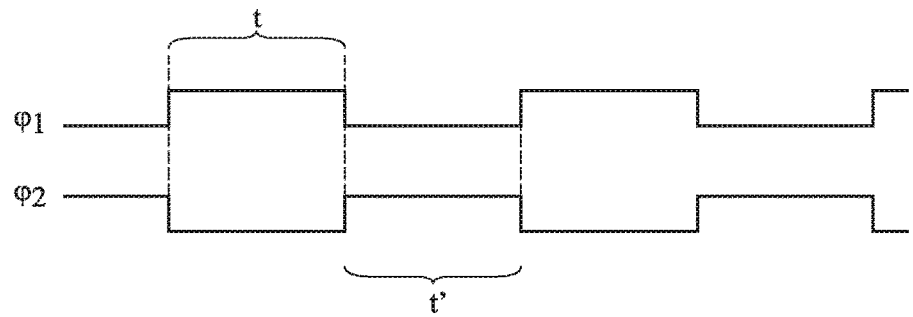
FIG. 3 is a timing diagram illustrating signals in the circuit of FIG. 2 according to an example embodiment.

FIG. 3 illustrates an example of the phase signals $\varphi_1$ and $\varphi_2$ controlling the chopper 201 of FIG. 2. As illustrated, these phase signals $\varphi_1$, $\varphi_2$ for example switch at the same time as each other, and have complementary values, signal $\varphi_1$ being high while the signal $\varphi_2$ is low, and then in a subsequent phase, the signal $\varphi_1$ being low while the signal $\varphi_2$ is high. The duration t of the high pulses of the signal $\varphi_1$, and the duration t' of the high pulses of the signal $\varphi_2$ are for example equal, such that the duty cycle is substantially 50 percent, for example with a tolerance of plus or minus 1 percent. For example, the duty cycle is at between 49.5 and 50.5 percent.

An advantage of the embodiment of FIG. 2 is that the sources of imprecision described with relation to the current sense amplifier 100 of FIG. 1 are cancelled, leading to improved accuracy. For example, calling again the resistance of the resistors 106 and 110 respectively $R_{IN}+\Delta R_{IN}/2$ and $R_{IN}-\Delta R_{IN}/2$, the currents conducted by the transistors 114 and 116 respectively $I_M+\Delta I_M/2$ and $I_M-\Delta I_M/2$, and the voltage offset of the amplifier 202 VOS, the output voltages $V_{OUT\_\varphi_1}$, $V_{OUT\_\varphi_2}$ during each phase $\varphi_1$, $\varphi_2$ are as follows:

$$V_{OUT\_\varphi_1} \cong I_{LOAD} \cdot R_{SENSE} \cdot \frac{R_{OUT}}{R_{IN}} + V_{OFFSET\_\varphi_1}, \text{ and}$$

$$V_{OUT\_\varphi_2} \cong I_{LOAD} \cdot R_{SENSE} \cdot \frac{R_{OUT}}{R_{IN}} + V_{OFFSET\_\varphi_2}$$

where:

$$V_{OFFSET\_\varphi_1} = \left[V_{OS} - \Delta I_M \cdot R_{IN} + I_M \cdot \Delta R_{IN} + I_{OUT} \cdot \frac{\Delta R_{IN}}{2}\right] \cdot \frac{R_{OUT}}{R_{IN}}, \text{ and}$$

$$V_{OFFSET\_\varphi_2} = -\left[V_{OS} - \Delta I_M \cdot R_{IN} + I_M \cdot \Delta R_{IN} + I_{OUT} \cdot \frac{\Delta R_{IN}}{2}\right] \cdot \frac{R_{OUT}}{R_{IN}}$$

Thus, taking the average of the output voltages $V_{OUT\_\varphi_1}$, $V_{OUT\_\varphi_2}$, the output voltage $V_{OUT}$ becomes:

$$V_{OUT} \cong I_{LOAD} \cdot R_{SENSE} \cdot \frac{R_{OUT}}{R_{IN}}$$

Figure 4:
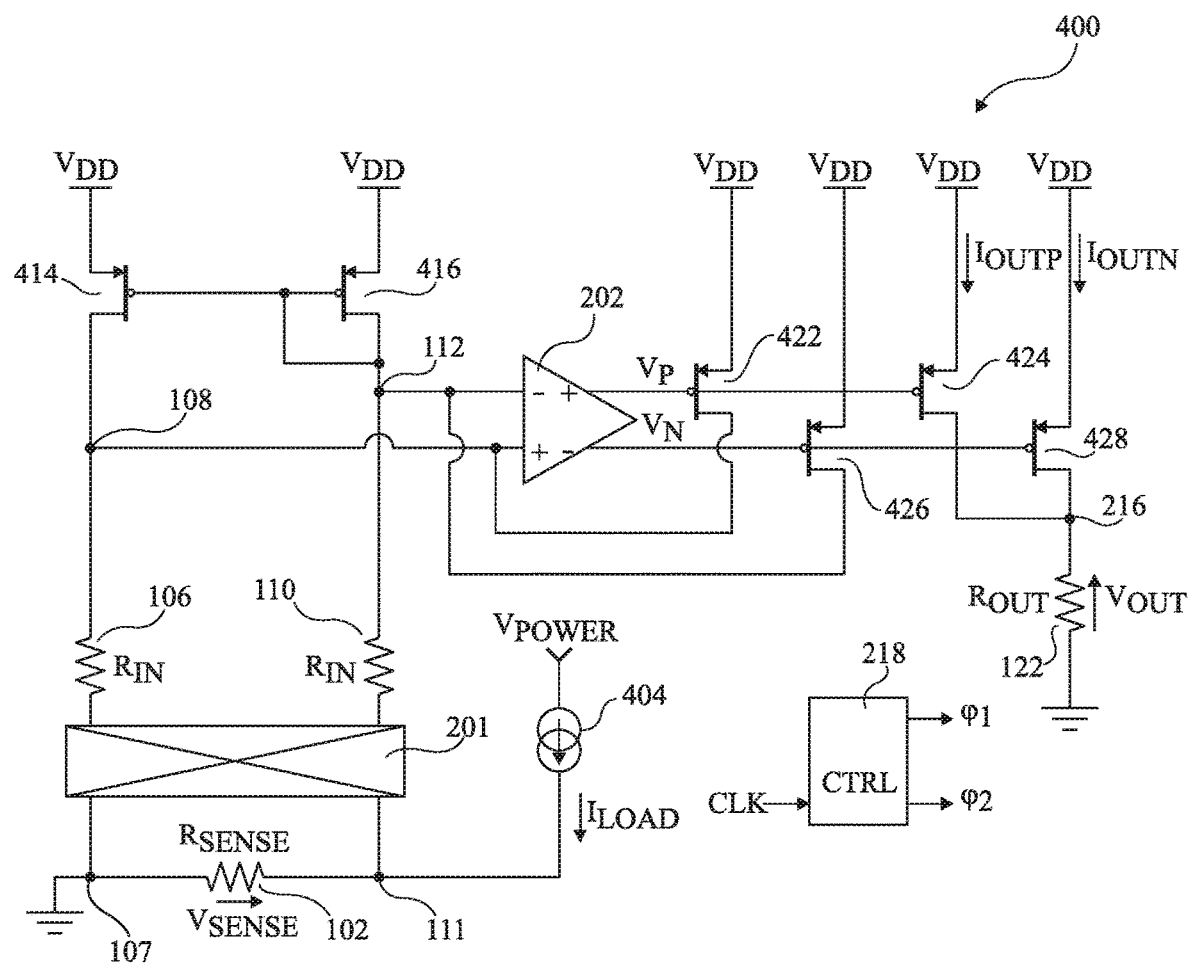
FIG. 4 schematically illustrates a current sense amplifier according to a further embodiment of the present disclosure.

FIG. 4 schematically illustrates a current sense amplifier 400 according to a further example embodiment similar to that of FIG. 2, but corresponding to an implementation in which the node 107 of the sense resistor 102 is coupled to ground, and the current source 104 is replaced by a current source 404 coupled between the sense resistor 102 and the supply voltage $V_{POWER}$. Features in common with the embodiment of FIG. 2 have been labelled with like reference numerals and will not be described again in detail.

In the embodiment of FIG. 4, the current mirror is for example formed by a p-channel MOS transistor 414 coupling the node 108 to a supply rail $V_{DD}$, and a p-channel MOS transistor 416 coupling the node 112 to the supply rail $V_{DD}$. The differential amplifier 202 is inverted, such that its negative input is coupled to the node 112, and its positive input is coupled to the node 108. Furthermore, in the embodiment of FIG. 4, the output signal $V_P$ of the differential amplifier 202 controls p-channel MOS transistors 422 and 424, and the output signal $V_N$ of the differential amplifier 202 controls p-channel MOS transistor 426 and 428. The transistor 422 is coupled between the node 108 and the supply rail $V_{DD}$, and the transistor 426 is coupled between the node 112 and the supply rail $V_{DD}$. The transistors 424 and 428 are each coupled between the supply rail $V_{DD}$ and the output node 216, and respectively conduct currents $I_{OUTP}$ and $I_{OUTN}$.

Operation of the current sense amplifier 400 of FIG. 4 is similar to that of the current sense amplifier 200 of FIG. 2, and will not be described again in detail.

An advantage of the current sense amplifier described herein is that it has improved accuracy. Furthermore, it also permits current to be detected in either direction through the sense resistor, which is for example of particular advantage in applications in which current may flow in both directions through the sense resistor, such as in the case of a USB type C port for example capable of power delivery according to the USB Power Delivery Specification Rev. 3.0 available for example at the site: http://www.usb.org/developers/powerdelivery/.

Figure 5:
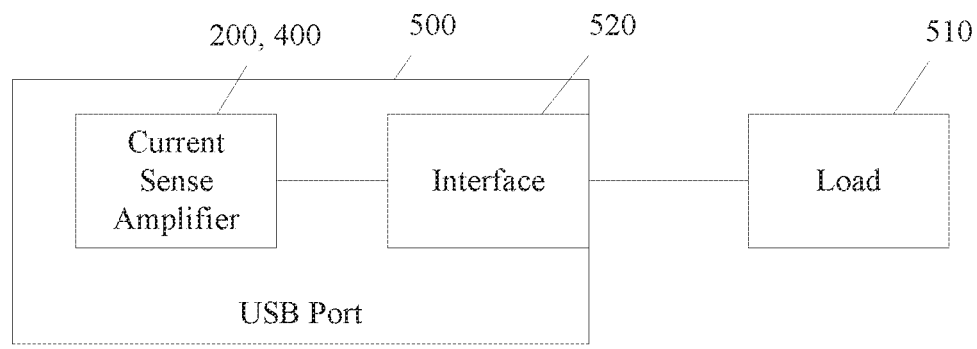
FIG. 5 is a block diagram of a universal serial bus (USB) type C port according to one embodiment of the present disclosure.

FIG. 5 is a block diagram of a universal serial bus (USB) type C port 500 that is electrically coupled to a load 510. The port 500 includes a current sense amplifier, such as the current sense amplifier 200 of FIG. 2 or the current sense amplifier 400 of FIG. 4, and an interface 520 that is configured to communicate with and provide power to the load 510.

Having thus described at least one illustrative embodiment, various alterations, modifications and improvements will readily occur to those skilled in the art. For example, it will be apparent to those skilled in the art that while embodiments have been described based on MOS transistor technology, other transistor technologies would be possible.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A current sense amplifier, comprising:
   a sense resistor configured to conduct a current to be measured;
   first and second intermediate nodes;
   a chopper electrically coupling the first and second intermediate nodes to first and second nodes of the sense resistor;
   a current mirror having first and second branches electrically coupled to the first and second intermediate nodes;
   a differential amplifier having inputs coupled to the first and second intermediate nodes and configured to generate a first voltage signal when a voltage at the first intermediate node is greater than a voltage at the second intermediate node, and to generate a second voltage signal when the voltage at the second intermediate node is greater than the voltage of the first intermediate node;
   a first transistor configured to be controlled by the first voltage signal and having a first main current conducting node coupled to the first intermediate node;

a second transistor configured to be controlled by the second voltage signal and a first main current conducting node coupled to the second intermediate node; and a first input resistor coupling the chopper to the first intermediate node and a second input resistor coupling the chopper to the second intermediate node.

2. The current sense amplifier of claim 1, further comprising an output resistor coupled to second main current conducting nodes of the first and second transistors.

3. The current sense amplifier of claim 1, further comprising:

an output resistor; and third and fourth transistors having respective main conducting nodes coupled to the output resistor, wherein the third and fourth transistors are configured to be respectively controlled by the first and second voltage signals.

4. The current sense amplifier of claim 1, wherein the chopper comprises:

a first switch coupling the first node of the sense resistor to the first input resistor;

a second switch coupling the second node of the sense resistor to the second input resistor;

a third switch coupling the first node of the sense resistor to the second input resistor; and a fourth switch coupling the second node of the sense resistor to the first input resistor.

5. The current sense amplifier of claim 4, further comprising a control circuit configured to generate, based on a clock signal:

a first phase signal for controlling the first and second switches; and a second phase signal for controlling the third and fourth switches.

6. The current sense amplifier of claim 5, wherein the control circuit is configured to control the chopper to have a duty cycle of between 49.5 and 50.5 percent.

7. The current sense amplifier of claim 1, wherein the current mirror comprises a third transistor coupling the first intermediate node to a supply voltage rail or ground rail and a fourth transistor coupling the second intermediate node to the supply voltage rail or ground rail, the third and fourth transistors having control nodes coupled together and to the first or second intermediate node.

8. A universal serial bus (USB) port capable of power delivery, comprising:

an interface configured to communicate with a load; and a current sense amplifier coupled to the interface and including:

a sense resistor configured to conduct a current to be measured;

first and second intermediate nodes;

a chopper electrically coupling the first and second intermediate nodes to first and second nodes of the sense resistor;

a current mirror having first and second branches electrically coupled to the first and second intermediate nodes;

a differential amplifier having inputs coupled to the first and second intermediate nodes and configured to generate a first voltage signal when a voltage at the first intermediate node is greater than a voltage at the second intermediate node, and to generate a second voltage signal when the voltage at the second intermediate node is greater than the voltage of the first intermediate node;

a first transistor configured to be controlled by the first voltage signal and having a first main current conducting node coupled to the first intermediate node; and a second transistor configured to be controlled by the second voltage signal and a first main current conducting node coupled to the second intermediate node, wherein the current sense amplifier includes:

an output resistor; and third and fourth transistors having respective main conducting nodes coupled to the output resistor, wherein the third and fourth transistors are configured to be respectively controlled by the first and second voltage signals.

9. The USB port of claim 8, wherein the current sense amplifier includes an output resistor coupled to second main current conducting nodes of the first and second transistors.

10. The USB port of claim 8, wherein the current sense amplifier includes a first input resistor coupling the chopper to the first intermediate node and a second input resistor coupling the chopper to the second intermediate node.

11. The USB port of claim 10, wherein the chopper comprises:

a first switch coupling the first node of the sense resistor to the first input resistor;

a second switch coupling the second node of the sense resistor to the second input resistor;

a third switch coupling the first node of the sense resistor to the second input resistor; and a fourth switch coupling the second node of the sense resistor to the first input resistor.

12. The USB port of claim 11, wherein the current sense amplifier includes:

a control circuit configured to generate, based on a clock signal;

a first phase signal for controlling the first and second switches; and a second phase signal for controlling the third and fourth switches.

13. The USB port of claim 8, wherein the current mirror comprises a third transistor coupling the first intermediate node to a supply voltage rail or ground rail and a fourth transistor coupling the second intermediate node to the supply voltage rail or ground rail, the third and fourth transistors having control nodes coupled together and to the first or second intermediate node.

14. A current sense amplifier, comprising:

a sense resistor configured to conduct a current to be measured;

a differential amplifier having first and second inputs and first and second outputs, the first and second inputs being respectively coupled to first and second nodes of the sense resistor;

a first transistor having a control node and first and second current conduction nodes, the control node being electrically coupled to the first output of the differential amplifier and the first current conduction node being electrically coupled to the second input of the differential amplifier;

a second transistor having a control node and first and second current conduction nodes, the control node of the second transistor being electrically coupled to the second output of the differential amplifier and the first current conduction node of the second transistor being electrically coupled to the first input of the differential amplifier;

first and second intermediate nodes respectively electrically coupled to the first and second inputs of the differential amplifier;
a chopper electrically coupling the first and second intermediate nodes to the first and second nodes of the sense resistor, respectively;
a current mirror having first and second branches electrically coupled to the first and second intermediate nodes, respectively; and
a first input resistor coupling the chopper to the first intermediate node and a second input resistor coupling the chopper to the second intermediate node.

15. The current sense amplifier of claim 14, further comprising:
an output resistor; and
third and fourth transistors having respective first current conduction nodes electrically coupled to the output resistor, respective second current conduction nodes electrically coupled to the second current conduction nodes of the first and second transistors, and respective control terminals electrically coupled to the first and second outputs of the differential amplifier, respectively.

16. The current sense amplifier of claim 14, wherein the chopper comprises:
a first switch coupling the first node of the sense resistor to the first input resistor;
a second switch coupling the second node of the sense resistor to the second input resistor;
a third switch coupling the first node of the sense resistor to the second input resistor; and
a fourth switch coupling the second node of the sense resistor to the first input resistor.

17. A current sense amplifier, comprising:
a sense resistor configured to conduct a current to be measured;
first and second intermediate nodes;
a chopper electrically coupling the first and second intermediate nodes to first and second nodes of the sense resistor;
a current mirror having first and second branches electrically coupled to the first and second intermediate nodes;
a differential amplifier having inputs coupled to the first and second intermediate nodes and configured to generate a first voltage signal when a voltage at the first intermediate node is greater than a voltage at the second intermediate node, and to generate a second voltage signal when the voltage at the second intermediate node is greater than the voltage of the first intermediate node;
a first transistor configured to be controlled by the first voltage signal and having a first main current conducting node coupled to the first intermediate node;
a second transistor configured to be controlled by the second voltage signal and a first main current conducting node coupled to the second intermediate nodes;
an output resistor; and
third and fourth transistors having respective main conducting nodes coupled to the output resistor, wherein the third and fourth transistors are configured to be respectively controlled by the first and second voltage signals.

18. The current sense amplifier of claim 17, wherein the current mirror comprises a third transistor coupling the first intermediate node to a supply voltage rail or ground rail and a fourth transistor coupling the second intermediate node to the supply voltage rail or ground rail, the third and fourth transistors having control nodes coupled together and to the first or second intermediate node.

19. A universal serial bus (USB) port capable of power delivery, comprising:
an interface configured to communicate with a load; and
a current sense amplifier coupled to the interface and including:
a sense resistor configured to conduct a current to be measured;
first and second intermediate nodes;
a chopper electrically coupling the first and second intermediate nodes to first and second nodes of the sense resistor;
a current mirror having first and second branches electrically coupled to the first and second intermediate nodes;
a differential amplifier having inputs coupled to the first and second intermediate nodes and configured to generate a first voltage signal when a voltage at the first intermediate node is greater than a voltage at the second intermediate node, and to generate a second voltage signal when the voltage at the second intermediate node is greater than the voltage of the first intermediate node;
a first transistor configured to be controlled by the first voltage signal and having a first main current conducting node coupled to a first one of the first intermediate node;
a second transistor configured to be controlled by the second voltage signal and a first main current conducting node coupled to a second one of the first and second intermediate nodes;
a first input resistor coupling the chopper to the first intermediate node; and
a second input resistor coupling the chopper to the second intermediate node.

20. The USB port of claim 19, wherein the chopper comprises:
a first switch coupling the first node of the sense resistor to the first input resistor;
a second switch coupling the second node of the sense resistor to the second input resistor;
a third switch coupling the first node of the sense resistor to the second input resistor; and
a fourth switch coupling the second node of the sense resistor to the first input resistor.

* * * * *